United States Patent
Li et al.

(10) Patent No.: US 9,390,915 B1
(45) Date of Patent: Jul. 12, 2016

(54) METHODS AND SYSTEMS FOR IMPROVED UNIFORMITY OF SIGE THICKNESS

(71) Applicant: Shanghai Huali Microelectronics Corporation, Shanghai (CN)

(72) Inventors: Quanbo Li, Shanghai (CN); Jun Huang, Shanghai (CN); Xiangguo Meng, Shanghai (CN)

(73) Assignee: SHANGHAI HUALI MICROELECTRONICS CORPORATION, Shanghai (CN)

( * ) Notice: Subject to any disclaimer, the term of this patent is extended or adjusted under 35 U.S.C. 154(b) by 0 days.

(21) Appl. No.: 14/691,520

(22) Filed: Apr. 20, 2015

(30) Foreign Application Priority Data

Jan. 23, 2015 (CN) .......................... 2015 1 0035496

(51) Int. Cl.
| | |
|---|---|
| *H01L 21/762* | (2006.01) |
| *H01L 21/02* | (2006.01) |
| *H01L 21/311* | (2006.01) |
| *H01L 21/66* | (2006.01) |

(52) U.S. Cl.
CPC ...... *H01L 21/02532* (2013.01); *H01L 21/0206* (2013.01); *H01L 21/02115* (2013.01); *H01L 21/02118* (2013.01); *H01L 21/02282* (2013.01); *H01L 21/31111* (2013.01); *H01L 21/31133* (2013.01); *H01L 21/76224* (2013.01); *H01L 22/26* (2013.01)

(58) Field of Classification Search
None
See application file for complete search history.

(56) References Cited

U.S. PATENT DOCUMENTS

| | | |
|---|---|---|
| 6,906,400 B2 | 6/2005 | Delhougne et al. |
| 6,946,350 B2 | 9/2005 | Lindert et al. |
| 6,949,482 B2 | 9/2005 | Murthy et al. |
| 7,494,884 B2 | 2/2009 | Lin et al. |
| 7,553,717 B2 | 6/2009 | Chakravarthi et al. |
| 7,615,390 B2 | 11/2009 | Meunier-Beillard et al. |
| 7,989,298 B1 | 8/2011 | Chan et al. |
| 8,017,487 B2 | 9/2011 | Chong et al. |
| 8,183,118 B2 | 5/2012 | Lu et al. |
| 8,674,447 B2 | 3/2014 | Adam et al. |
| 2005/0148147 A1 | 7/2005 | Keating et al. |
| 2006/0138398 A1 | 6/2006 | Shimamune et al. |
| 2008/0290370 A1 | 11/2008 | Han et al. |
| 2012/0319120 A1 | 12/2012 | He et al. |
| 2012/0319168 A1 | 12/2012 | Liu et al. |
| 2012/0326268 A1 | 12/2012 | Kato et al. |
| 2013/0032929 A1* | 2/2013 | Leobandung .......... H01L 21/84 257/621 |
| 2013/0071995 A1* | 3/2013 | Lin .................... H01L 29/66636 438/429 |
| 2015/0228793 A1* | 8/2015 | Chen ................... H01L 29/7851 257/401 |

FOREIGN PATENT DOCUMENTS

EP   1801864 B1   11/2009

* cited by examiner

*Primary Examiner* — Evren Seven
*Assistant Examiner* — Steven Christopher
(74) *Attorney, Agent, or Firm* — Kilpatrick Townsend & Stockton LLP

(57) ABSTRACT

A process is used to form a protective layer to cover a divot between two regions of a semiconductor material. During etching processes, the protective layer protects the divot to be etched away and reduces material loss of a Silicon (Si)-shallow trench isolation (STI) substrate. A selective coverage is provided to protect the height of the Si-STI substrate and an Si-STI interface. A desirable geometry can be obtained for forming a silicon germanium (SiGe) layer with uniform thickness near the divot.

17 Claims, 8 Drawing Sheets

METHODS AND SYSTEMS FOR IMPROVED UNIFORMITY OF SIGE THICKNESS

CROSS-REFERENCES TO RELATED APPLICATIONS

The present application claims priority to Chinese Patent Application No. 201510035496.0, filed on Jan. 23, 2015, entitled "METHODS AND SYSTEMS FOR IMPROVED UNIFORMITY OF SiGe THICKNESS", which is incorporated by reference herein for all purposes.

BACKGROUND OF THE INVENTION

The present invention is directed to semiconductor processes and devices.

Since the early days when Dr. Jack Kilby at Texas Instruments Inc. invented the integrated circuit, scientists and engineers have made numerous inventions and improvements on semiconductor devices and processes. The last five decades or so have seen a significant reduction in semiconductor sizes, which translate to ever increasing processing speed and decreasing power consumption. So far, the development of the semiconductor has generally followed Moore's Law, which roughly states that the number of transistors in a dense integrated circuit doubles approximately every two years. Now, semiconductor processes are pushing toward below 20 nm, where some companies are now working on 14 nm processes. Just to provide a reference, a silicon atom is about 0.2 nm, which means the distance between two discrete components manufactured by a 20 nm process is just about a hundred silicon atoms.

Manufacturing semiconductor devices has thus become more and more challenging and the boundaries of what is physically possible to manufacture have been pushed to the limit. Huali Microeletronic Corporation™ is one of the leading semiconductor fabrication companies that has focused on the research and development of semiconductor devices and processes.

One of the recent developments in semiconductor technologies has been utilization of silicon germanium (SiGe) in semiconductor manufacturing. For example, SiGe can be used for manufacturing of a complementary metal-oxide-semiconductor (CMOS) with an adjustable band gap. While conventional techniques exist for SiGe-based processes, these techniques are unfortunately inadequate for the reasons provided below. Therefore, improved methods and systems are desired.

BRIEF DESCRIPTION OF THE DRAWINGS

The present disclosure is described in conjunction with the appended figures.

Figure 1:
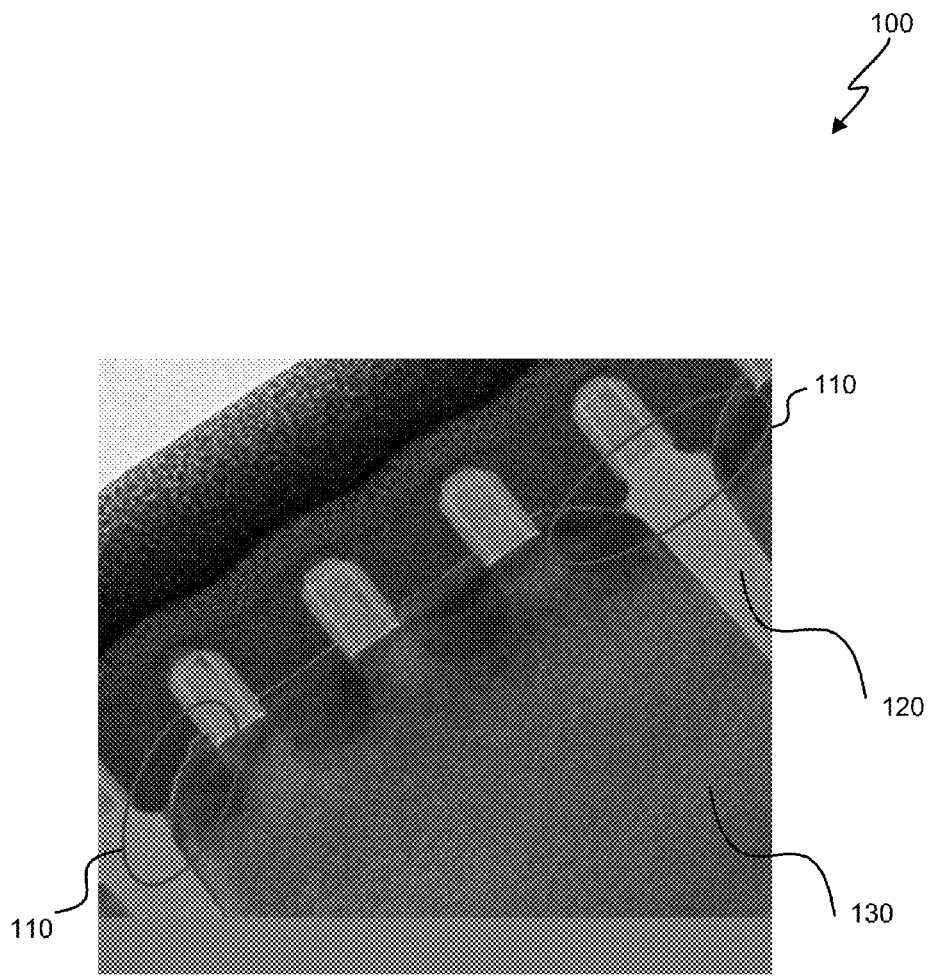
FIG. 1 illustrates an exemplary cross-sectional scanning electron microscopy image of germanium-on-silicon growth having a defect at the silicon (Si)-shallow trench isolation (STI) interface.

A further understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

The present invention is directed to semiconductor processes and systems. According to a specific embodiment, a protective layer of material is provided over a trench region, and the protective layer maintains the device geometry during the subsequent processes, such as plasma etching. There are other embodiments as well.

The ensuing description provides preferred exemplary embodiment(s) only, and is not intended to limit the scope, applicability or configuration of the disclosure. Rather, the ensuing description of the preferred exemplary embodiment(s) will provide those skilled in the art with an enabling description for implementing a preferred exemplary embodiment. It is understood that various changes may be made in the function and arrangement of elements without departing from the spirit and scope as set forth in the appended claims.

The present invention is directed to semiconductor processes and devices. More specifically, an embodiment of the present invention provides a process that forms a protective layer to cover a "divot" between two regions of a semiconductor material. During subsequent processes, the protective layer protects the divot from being etched away further. Later, when forming the SiGe layer near the divot, a desirable geometry can be obtained. There are other embodiments as well. In an embodiment, the present invention provides a selective coverage to protect the height of the Si-STI interface.

As an example, SiGe technology refers to semiconductor devices and processes that utilize SiGe material to improve device performance. For example, SiGe can be used in heterojunction bipolar transistor (HBT) that offers advantages over both conventional silicon bipolar and silicon CMOS for implementation of communications circuits. Among other features, the use of Ge material in these devices improves device performance. However, SiGe devices and processes have their challenges. Among other things, there are difficulties in growing lattice-matched SiGe alloy on Si. Uniformly growing SiGe at the Si-STI interface is desirable, as it increases the performance of the CMOS device. For example, SiGe processes for manufacturing CMOS and other types of devices may comprise various detention of logic gate patterning, such as 45/40 nm, 32/28 nm, and <22 nm, and it is important to maintain logic gate patterns and geometries.

FIG. 1 shows an exemplary cross-sectional transmission electron microscopy (TEM) image 100 of germanium-on-silicon growth having a defect at Si-STI interfaces. STI region 120 is used to reduce or prevent electrical current leakage between adjacent semiconductor device components, such as Si region 130. The circles 110 show interface regions between the STI region 120 and the Si region 130. As an example, the interface region between the STI region 120 and the Si region 130 may be referred to as a "divot" as mentioned above. At the interface regions 110, the desired geometry is to have clean corners (e.g., corners with a substantially right angle) and edges, where the surface of the silicon region 130 is substantially leveled. Unfortunately, the device geometry, as shown in FIG. 1, is less than desirable, as the silicon region 130 near the red circles 110 are rounded off, which is largely due to over-etching and/or other processes, as described below. For example, SiGe growing processes require preparation steps, such as silicon nitride (SiN) deposition, photoetching, recess groove etching, removing of photoresist, wet process cleaning, and others. These processes result in a thin STI junction or a thin Si-STI interface, such as the regions indicated by the red circles 110 in FIG. 1. Due to the heterogeneous Si-STI interface and poor surface morphology of the substrate, preparing additional SiGe layer(s) becomes difficult. Defects near the Si-STI interface may result in current leakage after the ion implantation and the silicide formation process. In addition, poor geometry as shown in FIG. 1 may also result in poor performance.

Figure 2:
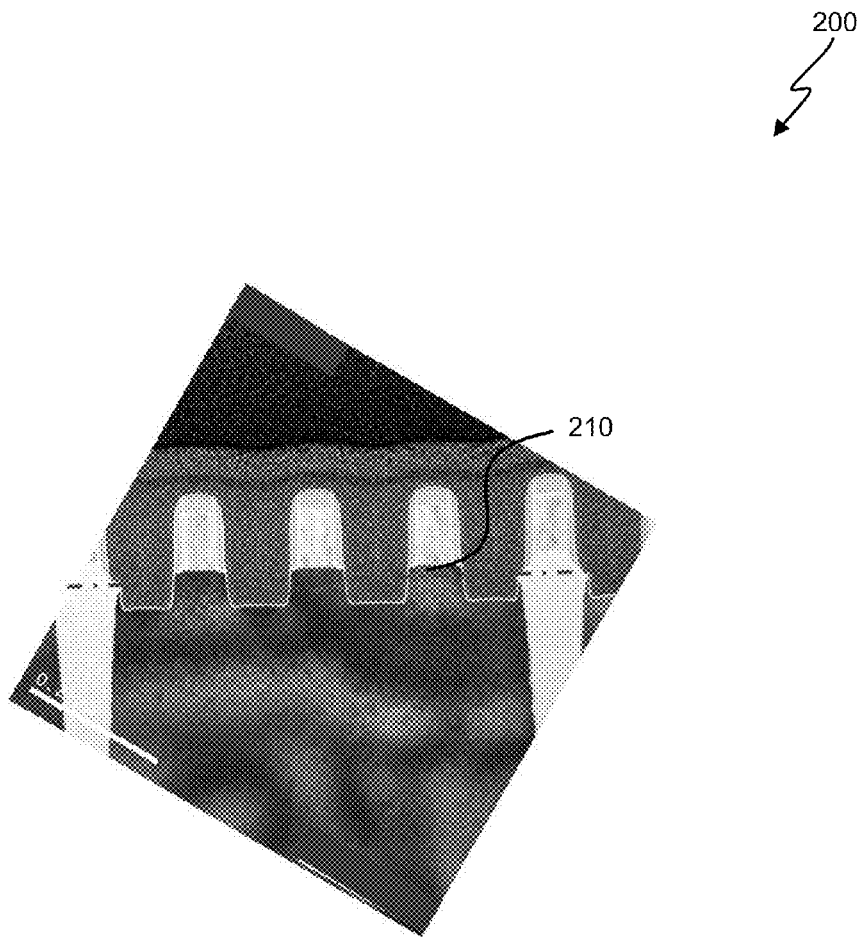
FIG. 2 illustrates another example of a cross-sectional scanning electron microscopy image of germanium-on-silicon growth having a defect at the Si-STI interface.

Referring to FIG. 2, another example of a cross-sectional TEM image 200 of germanium-on-silicon growth having a defect at Si-STI interface is shown. During the recess groove etching process, SiN may be stripped before the end of the etching process (during which some or all of the SiN layer may be removed), and the loss of SiN at certain locations may eventually cause Si losses and subsequent slow growth of the SiGe, thereby resulting in an unstable device.

Local poor uniformity of the SiGe growth is mainly attributed to poor uniformity of the Si thickness. Among other things, two processes cause poor uniformity and geometry of the Si, such as region 210. For example, one process is a pretreatment process of SiGe growth, and another process is a groove etching process. For example, Si is provided as a substrate material. In one or more steps, etching is performed to form trenches, from which Ge material may grow. The etching process may be performed with HCl material, which is used for a pretreatment process of SiGe growth. More specifically, used as an etchant, the vapor of HCl often reacts with Si to consume a certain amount of Si at undesirable regions. Conventional techniques exist for addressing this problem, but they have been inadequate. For example, while this problem can be improved by limiting the use of HCl, the risk of dislocation defects may also increase. Another technique is reducing the etching time, but etching residuals may stay on the substrate as a result. Therefore, there is a need for novel processes for reducing the Si loss and improving the uniformity of the substrate for SiGe growth, which is provided by the embodiments of the present invention.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter-clockwise have been used for convenience purposes only and are not intended to imply any particular fixed direction. Instead, they are used to reflect relative locations and/or directions between various portions of an object.

Also, it is noted that individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

Figure 3:
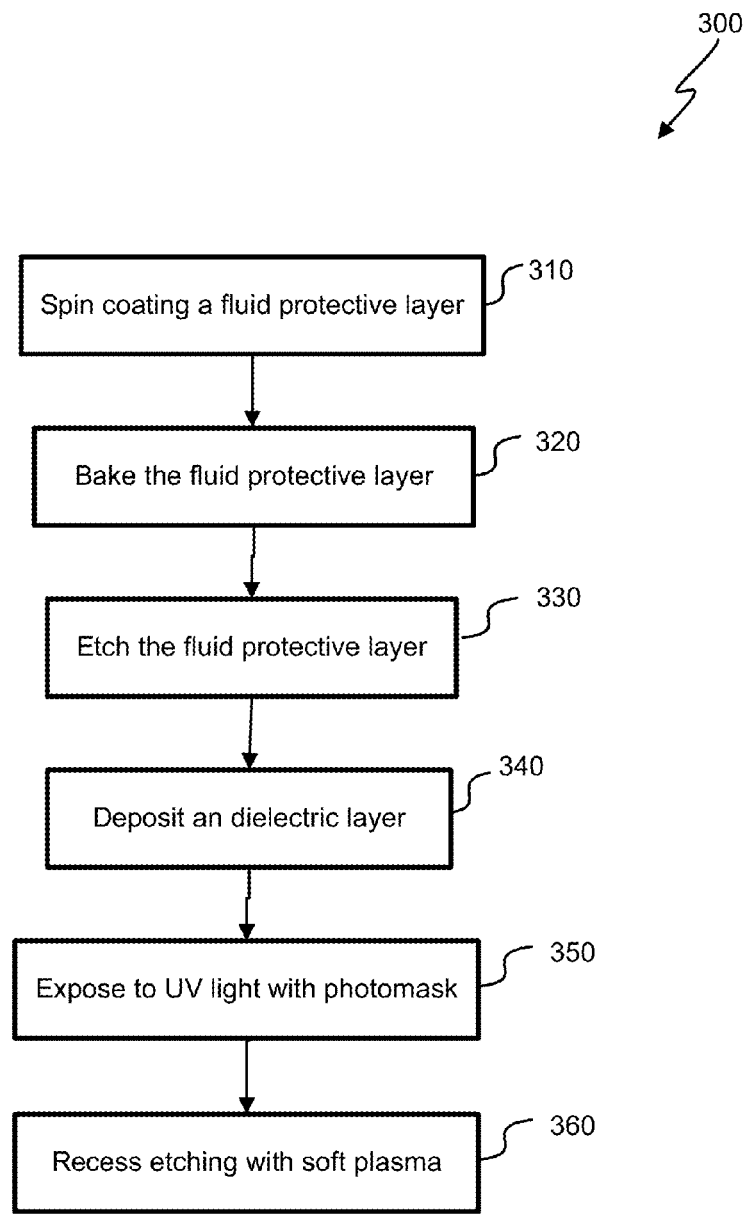
FIG. 3 illustrates a flowchart of an embodiment of a process for improving uniformity of silicon-germanium (SiGe) thickness.

Referring to FIG. 3, a flowchart of an embodiment of a process for improving uniformity of SiGe thickness is shown. This diagram is merely an example, which should not unduly limit the scope of the claims. One of ordinary skill in the art would recognize many variations, alternatives, and modifications. As an example, steps in FIG. 3 may be added, removed, replaced, rearranged, modified, repeated, and/or overlapped, and should not unduly limit the scope of claims. More specifically, an embodiment of the present invention provides a process that forms the protective layer to cover a "divot" between two regions of a semiconductor material. The cross section of the layer layout for each step is explained in greater detail in relation to FIG. 4 and FIGS. 5A-D below. It is noted that the steps in the flowchart are directed to improve uniformity of SiGe thickness, and reduce the loss of Si, and other processes and steps are performed.

Figure 5A:
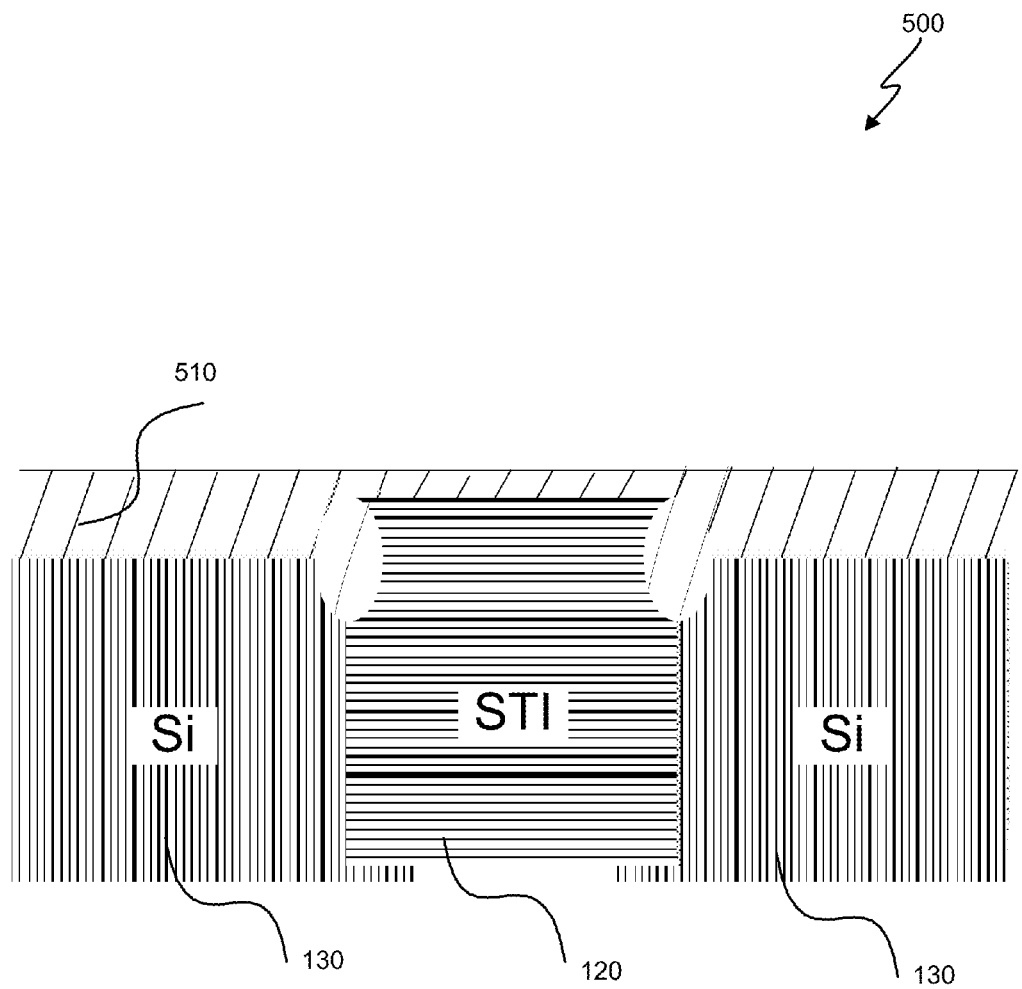
FIG. 5A illustrates a fluid protective layer added on top of the substrate corresponding to step 310 in FIG. 3, according to one embodiment.

The depicted portion of the process begins at step 310, where a fluid protective layer is spin-coated on the substrate with the STI region 120 and the Si region 130. For the fluid protective layer material, one or more organic materials may be used alone or in combination, such as carbon material, carbon-organic hybrid material, Si-organic hybrid material, bulk polymers, MEH-PPV, poly(ethylene dioxyiophene) (PEDOT), PEDOT:PSS, $Bi_2Te_3$, $Bi_2Se_3$, $Sb_2Te_3$, $CoS_2$, etc. Besides spin-coating, other methods may be used, such as dip coating, co-evaporating, thermal spray, and/or the like. Different spinning speeds may be used alone or in combination with the spin-coating process, such as 500 rpm, 1000 rpm, 1500 rpm, and/or the like. For example, FIG. 5A shows a fluid protective layer.

The fluid protective layer is baked, at step 320. In certain implementations, the baking time is about 2 to 10 minutes, and the baking temperature is about 200-300 degrees Celsius. It is to be appreciated that the baking parameters depend on the specific types of fluid that need to be dried, thermal budget, and/or other factors. This step is used to further dry or harden the fluid protective layer in order to protect the divots at the Si-STI interface. For example, once baked, the fluid protective layer is substantially a solid protective layer.

Figure 5B:
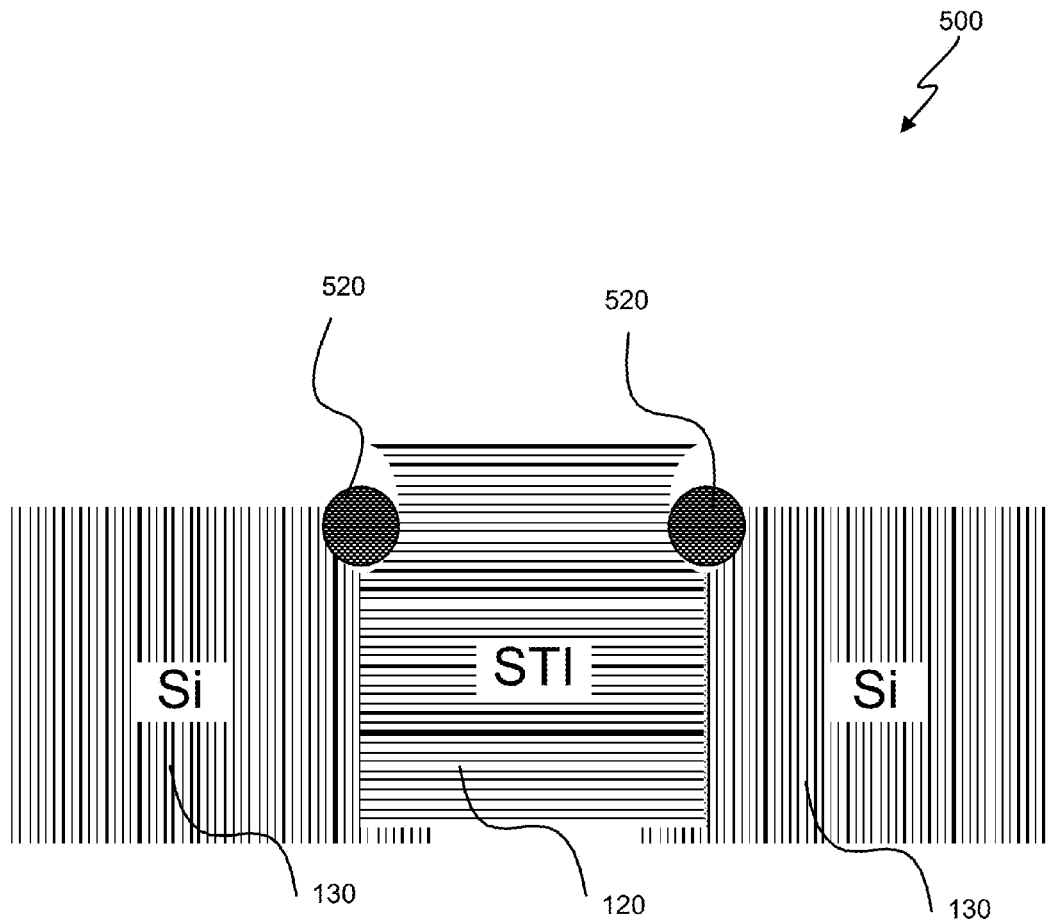
FIG. 5B illustrates a protective cover overlaying the divot region after an etching process corresponding to step 330 in FIG. 3, according to one embodiment.

The protective layer is etched at step 330 using a first etching process. For example, "first etching process" refers to the etching process performed at step 330, and it is understood that there can be other etching processes performed before or after the first etching process. In an embodiment, the Lam Kiyo® etch chamber is used for the first etching process. In another embodiment, the Lam 2300 Versys Kiyo 45® Poly Etch/Microwave Strip System is used for the first etching process. During the first etching processes, the regions of solid protective layer (baked and dried fluid protective layer) protecting the divot are kept and the solid protective layer on the STI region 120 and the Si region 130 are etched away. Later, when forming the SiGe layer near the divot, a desirable geometry can be obtained. It is to be appreciated that, since portions of the solid protective layer material are deposited into the divots, these portions are not etched away during the first etching process. For example, FIG. 5B illustrates the portion of protective layer positioned within the divots.

Figure 5C:
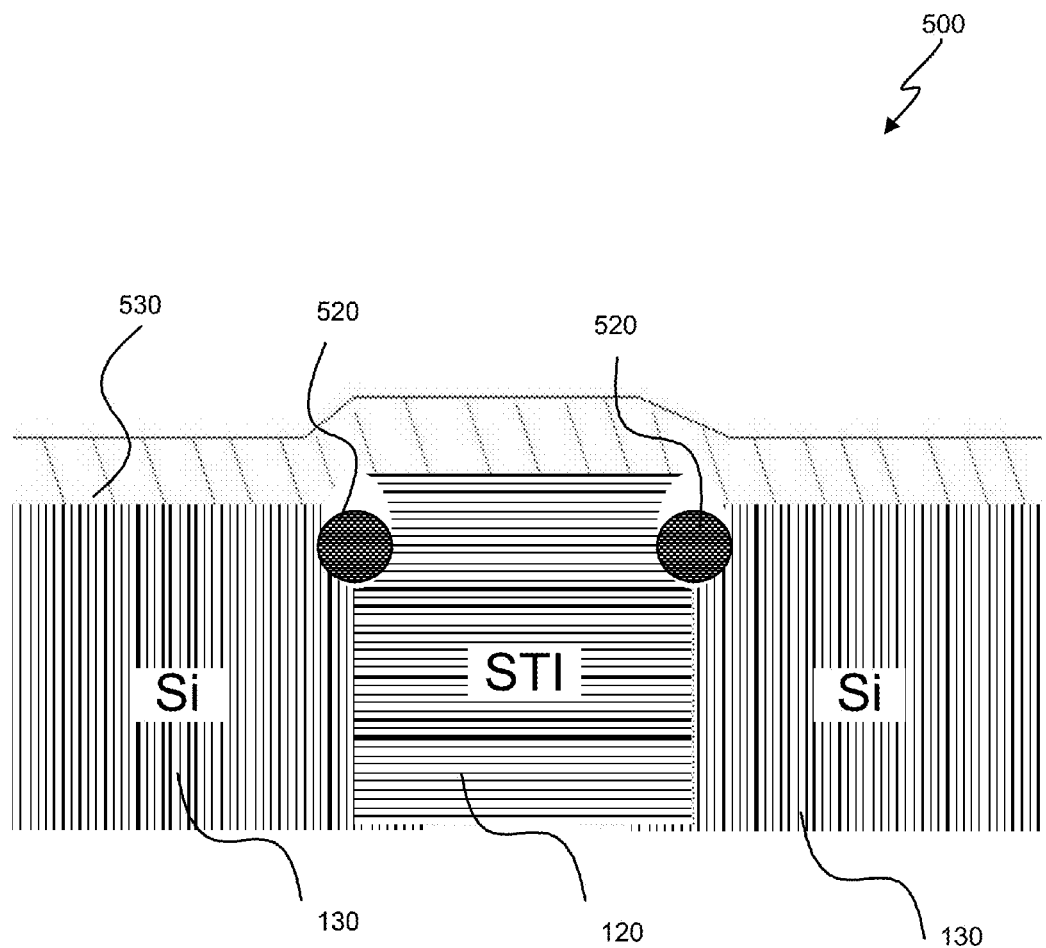
FIG. 5C illustrates an dielectric layer added on top of the etched substrate corresponding to step 340 in FIG. 3, according to one embodiment.

A dielectric layer is deposited, at step 340. It is to be appreciated that other steps, such as lithography, etching, trenching, and other processes, may be performed before the deposition of the dielectric layer at step 340. Depending on the application, SiN, $Al_2O_3$, ZnO, $SiO_2$, $MoS_2$, $HfO_2$, $TaSiO_x$, and/or the like may be used alone or in combination for the dielectric layer. The method for depositing dielectric layer can be atomic layer deposition (ALD), vapor deposition, chemical vapor deposition (CVD), metal-organic CVD (MOCVD), plasma-enhanced CVD (PECVD), sputter-deposition, ion mixing/plating beam supported deposition, plasma-assisted ALD, solution deposition, oxygen PEALD, vapor phase epitaxy, liquid phase epitaxy (LPE), pulsed laser deposition (PLD), and/or the like. For example, the deposition of the dielectric layer is illustrated in FIG. 5C. It is to be noted the protective layer are still positioned at the divots when the dielectric material is deposited.

At step 350, the dielectric layer is exposed to UV light with a photo-mask that defines groove regions for further etching process. The dielectric layer is removed by a recess etching with a soft plasma etching process, at step 360. As an example, the step 360 may further include a step for removing the dielectric layer and a first portion of the protective layer using a second etching process, and a step of removing a second portion of the protective layer and forming a trench at the Si region 130 using a third etching process. It is to be appreciated that the portions of protective layer material positioned at the divot region performed its function well, as the geometry of STI region and the Si are maintained during the etching process 360. More specifically, without the protective layer material at the divots, the plasma etching process performed at step 360 would remove both the dielectric material and portions of the STI and Si material, thereby producing the undesirable geometry illustrated in FIG. 1.

Figure 4:
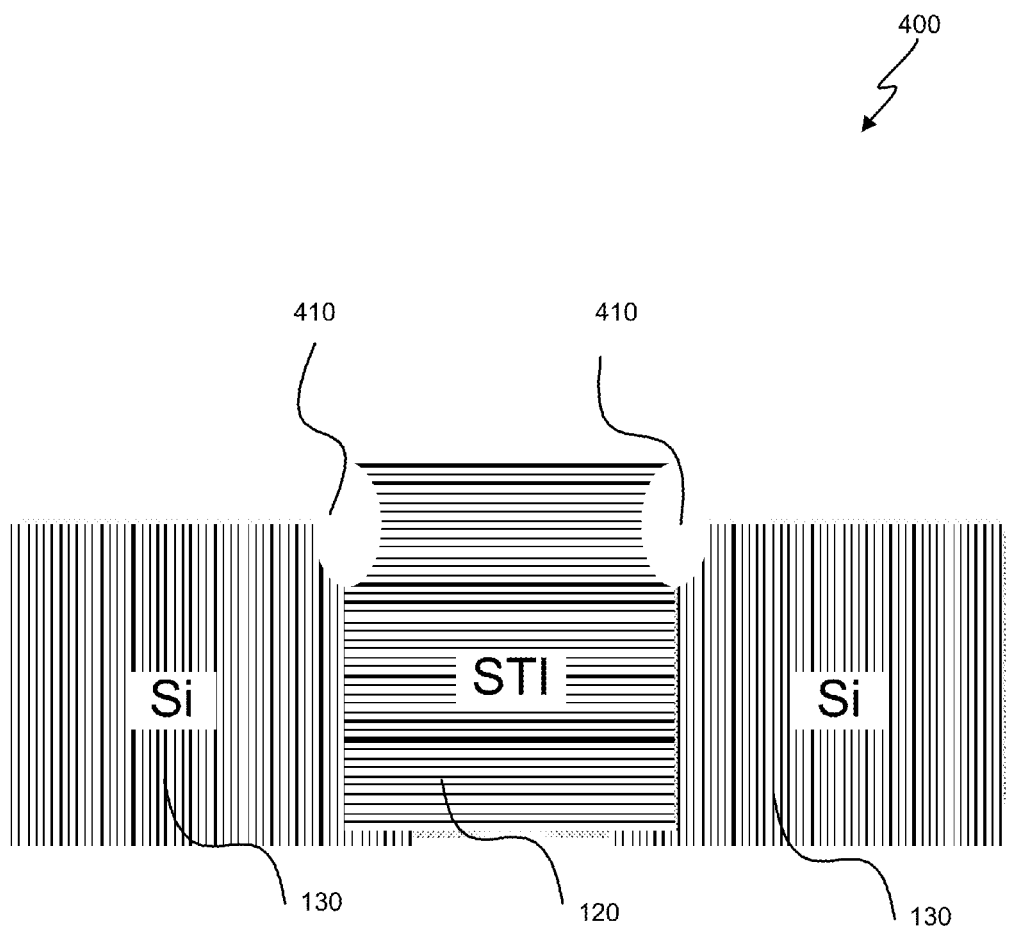
FIG. 4 illustrates a cross-section of a substrate having a divot region embedded at corners of the Si-STI interface, according to one embodiment.

Referring to FIG. 4, a cross-section of a substrate having a divot region 410 embedded at corners of the Si-STI interface is shown. This diagram is merely an example, which should not unduly limit the scope of the claims. One of ordinary skill in the art would recognize many variations, alternatives, and modifications. For example, the term "divot" includes, but is not limited to, a groove formation at the corners of the Si-STI interface. Among other things, divots and geometry thereof of the semiconductors may affect the junction current leakage and the performance of final device. As an example, the growth of SiGe is used for illustrating an embodiment of the present invention by forming the protective layer to cover the divot between the Si region 130 and the STI region 120. Interface between two semiconductor materials may have a divot at the corner of the forming interface, and various embodiments of the current invention can be applied to obtain a desirable geometry of the substrate for growing material besides SiGe for various purposes. In an embodiment, the Si region 130 can refer to an active area (AA).

Referring to FIG. 5A, a fluid protective layer 510 deposited on top of the substrate is shown in detail corresponding to step 310 in FIG. 3. This diagram is merely an example, which should not unduly limit the scope of the claims. One of ordinary skill in the art would recognize many variations, alternatives, and modifications. The fluid protective layer 510 has a good mobility to fill the divot region 410. For example, the fluid protective layer 510 can be hardened by baking with a temperature above 200 degree Celsius. In an embodiment, the fluid protective layer 510 is characterized by a thickness of about 5 nm to 30 nm. Among other things, the thickness of the fluid protective layer is related to the dimensions of the divots. It is to be appreciated that a thickness of about 5 nm to 30 nm effectively fills the divots. Additional thickness may result in additional processing time. When the thickness of the Si region 130 is different from that of the STI region 120, the fluid protective layer 510 is deposited by a thickness of about 5 nm to 30 nm on top of the STI region 120. The divot region 410 is fully filed with the fluid protective layer 510. In an embodiment, the fluid protective layer is formed by spraying a carbon-containing liquid on a top surface of the substrate, the divot being positioned near the top corner of the SI-STI interface. It is to be appreciated that the fluid protective layer of specific viscosity is selected to ensure that there is enough flow for the fluid to fill the divots without the fluid being too free or loose. In a specific embodiment, the fluid protective layer includes carbon material used for bottom anti-reflective coating (BARC), or spin-on carbon (SOC), or organic dielectric layer (ODL).

Referring to FIG. 5B, a protective cover layer 520 overlaying the divot region 410 after the first etching process is shown in detail corresponding to step 330 in FIG. 3. This diagram is merely an example, which should not unduly limit the scope of the claims. One of ordinary skill in the art would recognize many variations, alternatives, and modifications. For example, the first etching process includes an etchant that is substantially non-reactive against silicon material. In an embodiment, a plasma etching with low etching rate may be used with etchant comprising N2, H2, CO2, Ar, and/or He material. After the first etching process, the protective cover at the divot region 410 is positioned between the height of the Si region 130 and the height of the STI region 120, with a height ranging from about 5 nm to about 10 nm. The hardened protective cover layer 520 is formed by a baking process. For example, the baking process is performed at a temperature of about 200 to 300 degrees Celsius, for a duration of about 2 minutes to 10 minutes. It is to be appreciated that the protective cover layer 520 at the divot region 410 is useful in preventing or reducing Si material loss in subsequent processes, such as plasma etching.

Referring to FIG. 5C, a dielectric layer 530 positioned on top of the etched substrate is shown in detail corresponding to step 340 in FIG. 3. This diagram is merely an example, which should not unduly limit the scope of the claims. One of ordinary skill in the art would recognize many variations, alternatives, and modifications. In an embodiment, the dielectric layer 530 comprises silicon dioxide and/or silicon nitride material. In various implementations, SiN, $Al_2O_3$, ZnO, $SiO_2$, $MoS_2$, $HfO_2$, $TaSiO_x$, and/or the like may be used alone or in combination for the dielectric layer, which could be removed by the second etching process. The method for depositing dielectric layer includes atomic layer deposition (ALD), vapor deposition, chemical vapor deposition (CVD), metal-organic CVD (MOCVD), plasma-enhanced CVD (PECVD), sputter-deposition, ion mixing/plating beam supported deposition, plasma-assisted ALD, solution deposition, oxygen PEALD, vapor phase epitaxy, liquid phase epitaxy (LPE), pulsed laser deposition (PLD), and/or the like.

Figure 5D:
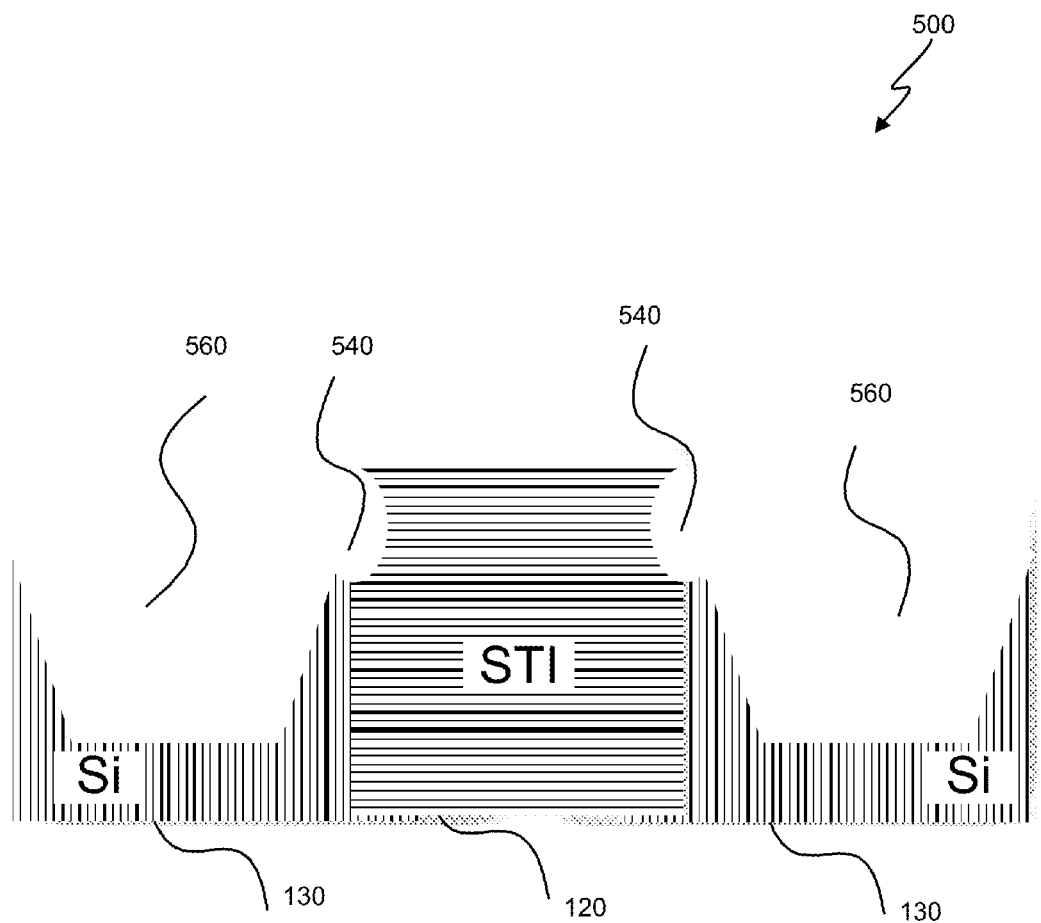
FIG. 5D illustrates a recess dry etching for removing a portion of the protective cover and forming a trench at the silicon region corresponding to step 360 in FIG. 3, according to one embodiment.

Referring to FIG. 5D, a recess dry etching for removing a portion of the protective cover and forming a trench at the silicon region is shown in detail corresponding to step 360 in FIG. 3. This diagram is merely an example, which should not unduly limit the scope of the claims. One of ordinary skill in the art would recognize many variations, alternatives, and modifications. During the recess dry etching processes, the protective cover layer 520 protects the divot to be etched away further. The second portion of the protective cover layer 520 is removed using the recess dry etching processes or the third etching process, which also form trench 560 at the Si region 130. Later when forming SiGe layer near the divot, a desirable geometry can be obtained. In an embodiment, the etching process further comprises forming an epitaxy layer of material overlaying the STI region 120. The top surface of the trench may be substantially leveled within a proximity of the epitaxy layer with thickness less than 5 nm. The epitaxy layer may comprise an exposed region above the top surface level, the exposed region being characterized by a height of 10 nm to 20 nm. The second etching process may include etchant that comprises an HCl material.

In an embodiment, the Lam Kiyo® etch chamber is used for the first etching process. In another embodiment, the Lam 2300 Versys Kiyo 45 ® Poly Etch/Microwave Strip System is used for the first etching process. In some embodiments, the method for the recess dry etching, first etching, second etching, and/or third etching can be performed using atomic layer deposition (ALD), vapor deposition, chemical vapor deposition (CVD), metal-organic CVD (MOCVD), plasma-enhanced CVD (PECVD), sputter-deposition, ion mixing/plating beam supported deposition, plasma-assisted ALD, solution deposition, oxygen PEALD, vapor phase epitaxy, liquid phase epitaxy (LPE), pulsed laser deposition (PLD), and/or the like.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method for processing a semiconductor substrate, the method comprising:
providing a semiconductor substrate comprising a first region and a second region, the first region comprising silicon material, the second region comprising a silicon dioxide material, the first region and second region sharing a divot region;
forming a fluid protective layer overlaying the semiconductor substrate and filling the divot region;
causing the fluid protective layer to harden;
partially removing the hardened protective layer using a first etchant without removing a protective cover overlaying the divot region;
forming an dielectric layer overlaying the semiconductor substrate and the protective cover;
removing the dielectric layer and a first portion of the protective cover using a second etchant; and
forming a trench at the first region and removing a second portion of the protective cover using a third etchant.

2. The method of claim 1 wherein the first region and the second region share a sidewall, the divot being positioned at corners of the first region and the second region.

3. The method of claim 1 wherein the fluid protective layer comprises material chosen from a group consisting of: bottom anti-reflective coating (BARC), spin-on carbon (SOC), and an organic dielectric layer (ODL).

4. The method of claim 1 wherein the fluid protective layer is characterized by a thickness of about 5 nm to 30 nm.

5. The method of claim 1 wherein the fluid protective layer is formed by spraying a carbon-containing liquid on a top surface of the semiconductor substrate, the divot being positioned near the top surface.

6. The method of claim 1 wherein the hardened protective layer is formed by a baking process, the baking process being performed at a temperature of about 200 to 300 degrees Celsius, for a duration of about 2 minutes to 10 minutes.

7. The method of claim 1 wherein the hardened protective layer is removing by an etching process, the first etchant comprising $N_2$, $H_2$, $CO_2$, Ar, and/or He material.

8. The method of claim 7 wherein the first etchant is substantially non-reactive against silicon material.

9. The method of claim 7 wherein the etching process is set to stop upon detecting a surface of the semiconductor substrate.

10. The method of claim 1 wherein the first etchant is substantially gaseous.

11. The method of claim 1 wherein the dielectric layer comprises silicon dioxide and/or silicon nitride material.

12. The method of claim 1 further comprising forming an epitaxy layer of material overlaying the trench.

13. The method of claim 1 wherein the second etchant comprises an HCl material.

14. A method for processing a semiconductor substrate, the method comprising:
providing a silicon substrate, the silicon substrate having a first region;
defining an isolation region;
forming a shallow trench at the isolation region;
depositing a first material to form a second region, the second region sharing a divot region with the first region;
forming a fluid protective layer overlaying the semiconductor substrate and filling the divot region;
causing the fluid protective layer to harden;
partially removing the hardened protective layer using a first etchant without removing a protective cover overlaying the divot region;
forming a dielectric layer overlaying the semiconductor substrate and the protective cover; and removing the dielectric layer and a first portion of the protective cover using a second etchant;

forming a trench at the first region and removing a second portion of the protective cover using a third etchant.

15. The method of claim 14 wherein the first material comprises silicon dioxide and/or silicon nitride material.

16. The method of claim 14 further comprising cleaning a surface of the trench.

17. The method of claim 14 wherein the hardened protective layer comprises organic material.

* * * * *